United States Patent [19]

Liedberg

[11] Patent Number: 5,550,514
[45] Date of Patent: Aug. 27, 1996

[54] DIGITAL CONTROLLED XTAL OSC

[75] Inventor: Nils P. Å. Liedberg, Stockholm, Sweden

[73] Assignee: Telefonaktiebolaget LM Ericsson, Stockholm, Sweden

[21] Appl. No.: 234,109

[22] Filed: Apr. 28, 1994

[30] Foreign Application Priority Data

Apr. 28, 1993 [SE] Sweden ................... 9301435

[51] Int. Cl.$^6$ ........................................... H03L 7/06
[52] U.S. Cl. ............... 331/1 A; 331/25; 331/17; 331/DIG. 2; 327/141; 327/158; 327/276; 375/376
[58] Field of Search .............. 328/55, 56; 307/269; 331/11, 17, 1 A, 25, DIG. 2; 327/141, 161, 158, 149, 276, 277, 278; 375/376

[56] References Cited

U.S. PATENT DOCUMENTS

| | | | |
|---|---|---|---|
| 4,119,796 | 10/1978 | Jones | 328/56 X |
| 4,677,648 | 6/1987 | Zurfluh | 375/376 |
| 4,795,985 | 1/1989 | Gailbreath, Jr. | 327/158 |
| 4,796,095 | 1/1989 | Shimada | 328/55 X |
| 4,859,954 | 8/1989 | Yoshimura | 328/155 |
| 4,868,514 | 9/1989 | Azevedo et al. | 331/25 |
| 4,975,593 | 12/1990 | Kurakazu et al. | 307/269 |
| 5,012,198 | 4/1991 | Okada et al. | 327/152 |
| 5,036,297 | 7/1991 | Nakamura | 331/17 |
| 5,079,519 | 1/1992 | Ashby et al. | 331/1 A |
| 5,081,655 | 1/1992 | Long | 375/373 |
| 5,118,975 | 6/1992 | Hillis et al. | 307/602 |
| 5,150,068 | 9/1992 | Kawashima et al. | 328/155 |
| 5,278,457 | 1/1994 | Fumita | 307/269 |
| 5,281,874 | 1/1994 | Sorrells et al. | 307/606 |

FOREIGN PATENT DOCUMENTS 2236223  3/1991  United Kingdom .

Primary Examiner—Benny T. Lee
Assistant Examiner—Arnold Kinkead
Attorney, Agent, or Firm—Burns, Doane, Swecker & Mathis

[57] ABSTRACT

An unlimited number of steps or increments of given size are obtained in a delay line for phase alignment of, for instance, the signal from a crystal oscillator by momentarily switching between two parallel delay lines. One delay line operates as an active or enabled delay line while the other line is disabled or inactive. It is ensured at the same time that the inactive delay line produces a signal which has the same relative phase as the active delay line, this absolute phase differing by $N \times 2\pi$, where N is a positive or a negative integer other than zero. The active delay line operate constantly within its regulation range and the phase of the local oscillator can be kept continuously locked to the phase of the reference signal.

17 Claims, 4 Drawing Sheets 5,550,514

DIGITAL CONTROLLED XTAL OSC

TECHNICAL FIELD

The present invention relates to a method and to an arrangement for adding or subtracting an unlimited number of small delay steps or increments for the purpose of compensating for a phase difference and a frequency difference between a local clock and a reference clock, and more particularly to the use of a method and a device which use two delay lines in parallel.

PRIOR ART

Present-day conventional data-based electronic systems are all based essentially on the presence of a local clock generator whose clock frequency controls the local system. In order to be able to work with the local system in relation to the outer world, it is necessary generally to synchronize the local clock with the outer world. This is normally effected by phase locking the local oscillator to some external reference with the aid of a feedback phase locking loop. Such a device is normally designated PLL (Phase Locked Loop). In this regard, the local oscillator may be a freely oscillating oscillator or an oscillator which uses a crystal or similar type of resonator element as the frequency determining element. In this latter case, the oscillator retains frequency and phase with a high degree of accuracy and over a longer period of time, even should the external reference fail. There is normally used a phase detector which applies an analog control voltage to a voltage controlled oscillator (VCO) or a voltage controlled crystal oscillator (VXCO).

According to the present standpoint of techniques, it is possible to compensate for a delay which expresses itself as a phase error against the local clock with the aid of a variable delay line. For instance, the undesired external delay can be compensated for by virtue of the variable delay inserting a corresponding delay in the clock generator of the local system, so as to equalize the phase error. There is also often selected a fixed additional delay together with the variable delay, thereby enabling the variable delay to be made smaller. However, this will not be successful when the delay to be compensated may be arbitrary and vary widely with time.

For instance, U.S. Pat. No. 4,868,514 discloses an apparatus and a method for digital compensation of oscillator operation. This publication intends to provide phase alignment between two clock signals which operate at practically the same frequency, wherein a variable digital delay delivers a corrected clock signal whose phase is aligned with the phase of the other clock. U.S. Pat. No. 5,079,519 discloses a digital phase locked loop for a logic gate group, wherein the arrangement maintains a determined phase delay between an input signal and an output signal by virtue of a counter selecting an appropriate tapping-point on a delay line. UK Patent Specification GB-A 2,236,223 discloses a similar digital phase locked loop, which also includes a tapped delay line which produces a multiple of signals of different phases, of which one signal is chosen through a selection circuit. Other examples of this technique using a delay line in accordance with the present standpoint of techniques are to be found in other documents, such as in U.S. Pat. Nos. 5,012,198, 4,795,985 and 4,677,648, for instance.

The following advantages are obtained with the technique of choosing a digital solution instead of the conventional solution using a VCO:

A digital solution can be integrated readily in a user specific integrated circuit (ASIC).

Error monitoring mechanisms can be readily implemented in a digital system and added thereto. This is more difficult in the case of an analog solution, since it is then necessary to measure the analog control signal.

A digital solution is also generally more construction-friendly and production-friendly than an analog solution.

A common drawback with all of the known prior art solutions is that problems occur when the delay is changed with time to an extent such that the delay lies in the proximity of the maximum or the minimum possible delay that can be obtained with the variable delay line. In those cases where large changes in the delay are expected, it is necessary to include in the delay line a large delay interval which will enable the locked phase alignment in the circuit to be readily maintained. In turn, such a large phase locking interval will result in relatively poor phase resolution and/or phase accuracy. Another method of overcoming this drawback is to include a logic circuit which will ensure that it is possible to jump back, for instance $2\pi$ in absolute phase with the delay line and again lock-in the phase locking loop somewhere in the centre of the adjustable region of the delay line.

A backward jump of one period ($2\pi$) in the delay is not trivial, since the step length can vary greatly in different examples of the same circuit and may, for instance, be in the order of 0.10–0.3 ns. In addition, a certain amount of time is needed to ensure that the relative phase coincides after the phase jump, and consequently noticeable discontinuities can be expected with necessity when practicing this technique.

There is therefore a need for a simple solution to the problem of causing an oscillator to faithfully follow the phase of an external or internal reference signal whose phase changes with time by many whole periods, but while retaining a continuous phase for the output signal from the oscillator without the occurrence of phase jumps or transients in the output signal.

SUMMARY OF THE INVENTION

In accordance with a method and a device according to the present invention, there is created a possibility of adding or subtracting an unlimited number of small delay steps to and from a clock signal from an oscillator, there being used a delay line which has a limited number of series-connected small delay elements and the signal is tapped-off after a digitally selectable number of delay steps.

In accordance with a first object of the present invention, an unlimited number of steps of given size are obtained in a delay line by momentarily switching to another delay line, wherein this momentary switching between delay lines is effected by switching from an enabled or active delay line to an inactive or disabled phase-aligned delay line which has been regulated so that the inactive delay line has a delay which is suitably greater or smaller than the delay of the active delay line by one clock period, thereby enabling the phase of the stable local oscillator to be maintained continuously even when the phase of the reference signal continuously changes, for instance when there is constantly a small frequency difference between the frequency of the local oscillator and the frequency of the reference signal.

In accordance with a second object of the present invention, after having switched momentarily between delay lines, the delay line which was earlier active becomes passive and is prepared for the next momentary switching between said lines in a corresponding manner when the phase again changes to an extent which makes it suitable to again time-shift the delay line by, for instance, one clock period but while maintaining continuous locking of the oscillator output signal.

According to a first embodiment of the present invention, there is used a delay line array comprised of two separate delay lines having digitally selectable tapping points to achieve an active and a passive delay line for phase alignment of the signal from the oscillator.

According to a second embodiment of the present invention, the delay line array used is comprised of one delay line having two arrays of digitally selectable tapping points to obtain an active and a passive delay line for phase alignment of the signal from the oscillator.

BRIEF DESCRIPTION OF THE DRAWINGS

The invention will now be described with reference to exemplifying embodiments thereof and also with reference to the accompanying drawings, in which.

BEST MODE OF CARRYING OUT THE INVENTION

Figure 1:
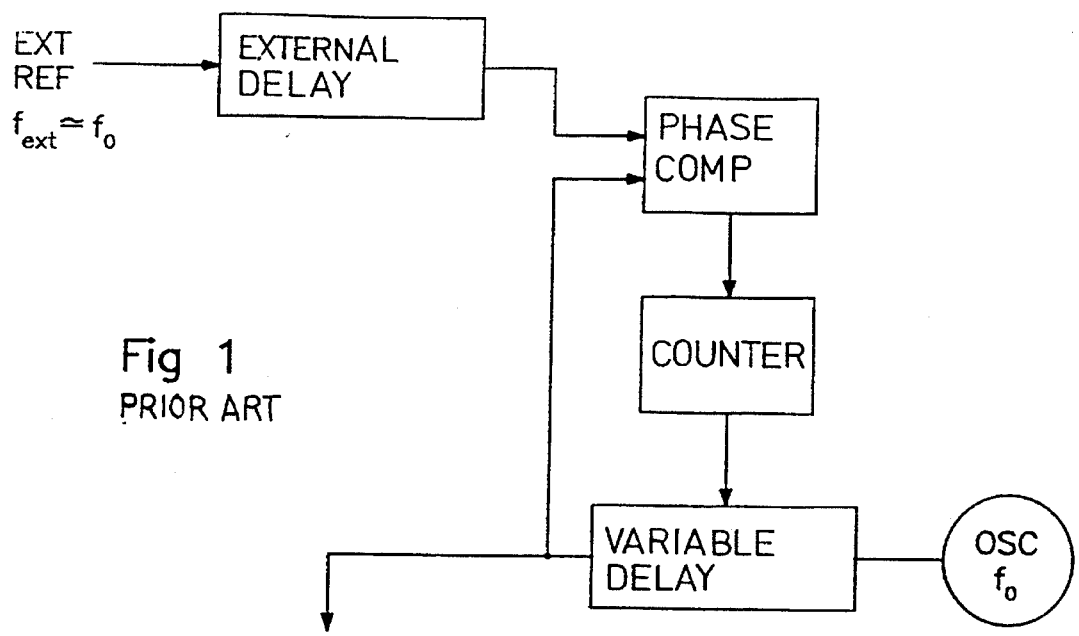
FIG. 1 illustrates a conventional device for aligning the phase of a local clock, for instance a crystal oscillator, to an external reference.

FIG. 1 is a simplified block schematic which illustrates phase compensation of an internal oscillator in relation to an external reference signal which is also the subject of an external delay, in accordance with the known prior art. This example of the known prior art assumes that the oscillator has, in principle, the same frequency as the reference, since the circuit solely compensates for phase errors. In the illustrated case, it will be necessary sooner or later to reset the variable delay with at least plus or minus one period, so as not to fall outside the regulation or adjustment range of the delay line.

Figure 2:
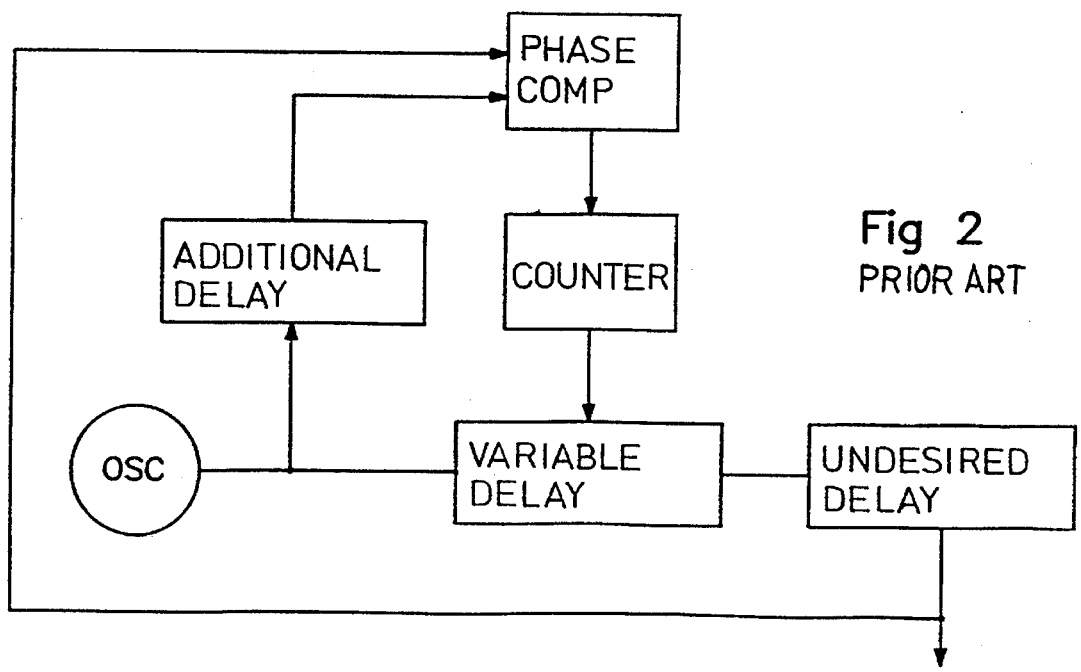
FIG. 2 illustrates a conventional device for aligning the phase of a local clock to an undesired internal delay.

FIG. 2 is a block schematic which illustrates correspondingly the phase compensation of a local oscillator in accordance with the same principle as that illustrated in FIG. 1. The undesired delay occurs, for instance, because clock control normally requires buffering in order to be able to provide all digital circuits on a card or board with a common simultaneous clock. This buffering delays the clock signal and therewith consequently introduces a phase error which is indicated by an undesired delay in the block. This undesired delay may vary in accordance with variations in the circuits used. In order to establish a given phase for the local clock, there is used a fixed additional delay which is larger than the undesired delay and after the undesired varying delay the phase for the local clock can be established in accordance with the function illustrated in FIG. 2, with the aid of a phase comparator and a variable delay. Because the undesired delay can be compensated-out in this way, it is possible to work at a higher clocking frequency and to maintain synchronism to a better extent than would otherwise be possible.

Figure 3:
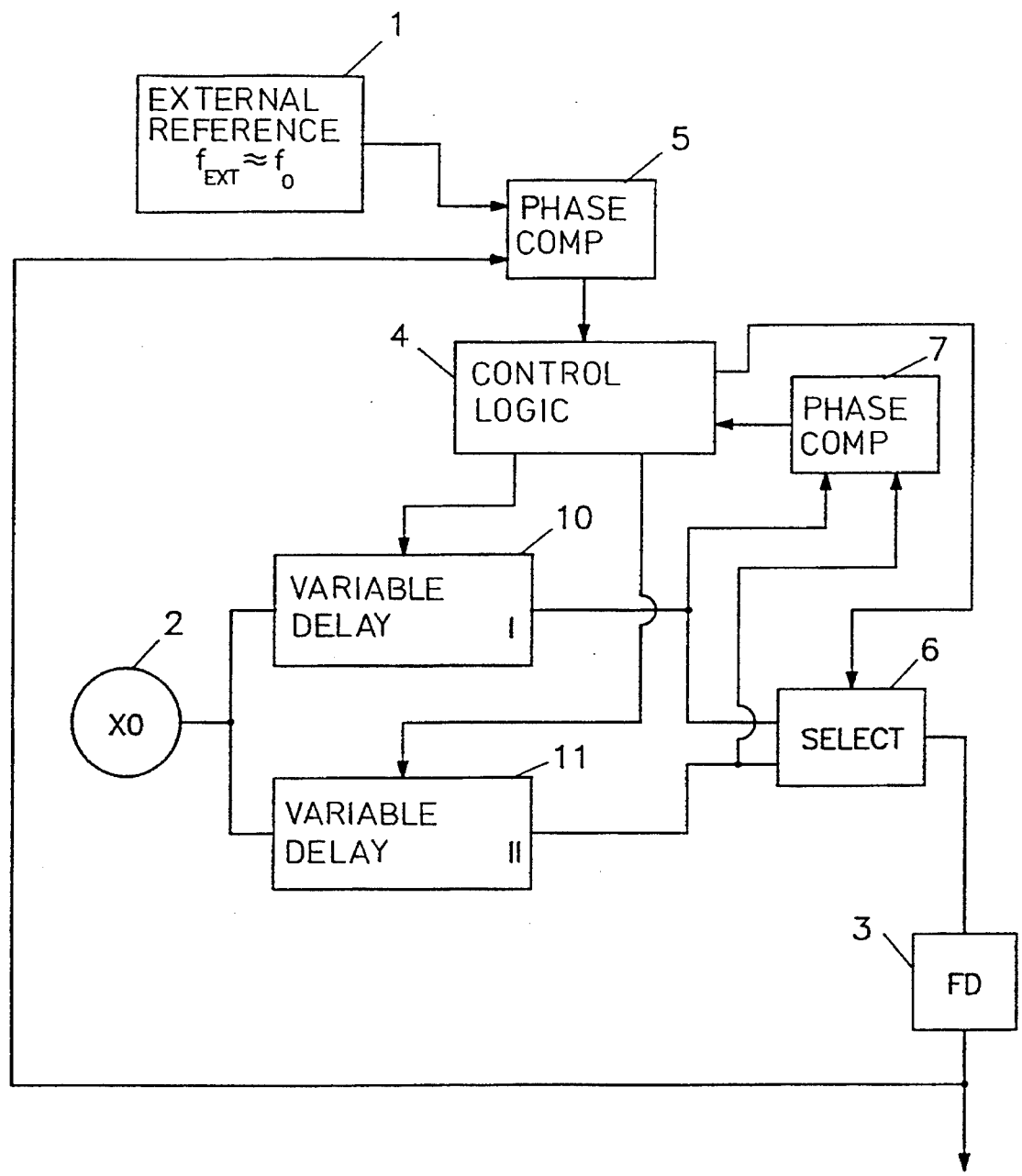
FIG. 3 illustrates a simplified device constructed in accordance with the present invention for continuously aligning a local oscillator with the aid of two alternating delay lines.

FIG. 3 is a block schematic which illustrates an inventive device for phase locking onto a reference clock, wherein an undesired delay FD is compensated for at the same time. The inventive device permits a digitally continuous incrementally variable change in the delay and compensates the phase with, in principle, an unlimited number of steps. The device illustrated in FIG. 3 includes a local clock pulse generator 2 in the form of a crystal oscillator XO whose output signal shall be compensated for the delay FD, for instance in a buffer arrangement 3, it being desired that the phase of the local clock will coincide with an external reference 1. The external reference 1 is considered to have the same frequency as the local crystal oscillator XO. A phase comparison with the outer reference is effected conventionally with the aid of a phase comparator 5 which steers a control logic 4. The control logic includes a conventional up-and-down counter which steers two variable delay lines 10 and 11 which are parallel connected in series with the local clock pulse generator 2. In turn, each delay line 10 and 11 includes a finite number of small delay elements, wherein a delay is obtained by digitally controlling the circuit so that the signal will be taken out after having passed a given number of such incremental delay steps. The circuit also includes a selection circuit which is controlled by control logic to select the signal from either of the variable delay lines 10 and 11 and to deliver the signal to the buffer arrangement 3 which implements the delay FD, which is not fully known and may possibly vary. The outputs from the two variable delay lines 10 and 11 are also delivered to a further phase comparator 7 which operates in principle in the same manner as the phase comparator 5. In the case of the illustrated, preferred embodiment, the control logic operates with the assumption that the phase comparator 7 of this exemplifying embodiment is supplied on its inputs with signals that have an absolute phase difference $2N\pi$, where n is a positive or a negative integer other than zero. In the preferred, exemplifying embodiment $N=-1$ or $+1$, which is the most favourable value with regard to the delay line. In turn, the phase comparator 7 delivers a control signal to the control logic 4.

The device illustrated in FIG. 3 operates in the following manner. The variable digital delay lines 10 and 11 are stepped through the control logic in response to the control signal from the phase comparator in a known manner, so that the signal phase delivered by both the variable delay line 10 and the variable delay line 11 will each compensate for the delay FD in the buffer arrangement 3 so that the phase of the local clock will coincide with the external reference 1. In this regard, the counters of the control logic will steer the variable delay lines 10 and 11 so that one delay line will lie within a first half of its full delay interval, while the other delay line will lie correspondingly in another half of its full delay interval, i.e. there will be a difference of, for instance, precisely $2\pi$ in absolute phase between their outputs which supply the selection circuit 6.

The control logic 4 causes the selection circuit to choose one input signal which in this case is then sent to the buffer arrangement 3. Phase errors between the signal from the crystal oscillator 2 and the external reference will be compensated for continuously and constantly in small discrete steps. Should the active delay circuit delivering the signal distributed by the selection circuit 6 to the buffer arrangement 3 begin to approach its phase compensation limit, the control logic will conventionally order the selection circuit to switch-over and instead allow the signal from the other delay line to pass through, this other delay line hitherto being the inactive signal transducer. The changeover between these variable delay lines occurs momentarily on the local clock since, in principle, they have the same relative phase and since the absolute phase in the illustrative preferred embodiment differs between the two delay lines 10 and 11 by precisely 2π.

Consequently, such a command from the control logic 4 to the selection circuit will result in the earlier active variable delay line becoming passive and the earlier passive circuit becoming active. If the phase drift then continues so as to pass the delay regulation limit of the now passive circuit, the control logic resets the counter value thereof so that it will jump 2π forwards or backwards in phase. This phase jump, however, will not affect the phase of the local clock, which is continuously supplied via the active delay line. Upon completion of the phase jump of 2π, the relative phase of the passive delay line can again be obtained equal to the phase of the active delay line, with the aid of the phase comparator 7 and the control logic. Thus, there is now no critical time period in which to achieve this phase realignment. By constantly switching between the variable delays 10 and 11 in the described manner and then adjusting the inactive delay line, it is possible to adjust the delay with an unlimited number of unit steps without progressing beyond the phase adjustment range and without the outgoing signal phase being involved in the otherwise necessary phase jump N×2π, where N is a positive or a negative integer.

Figure 4:
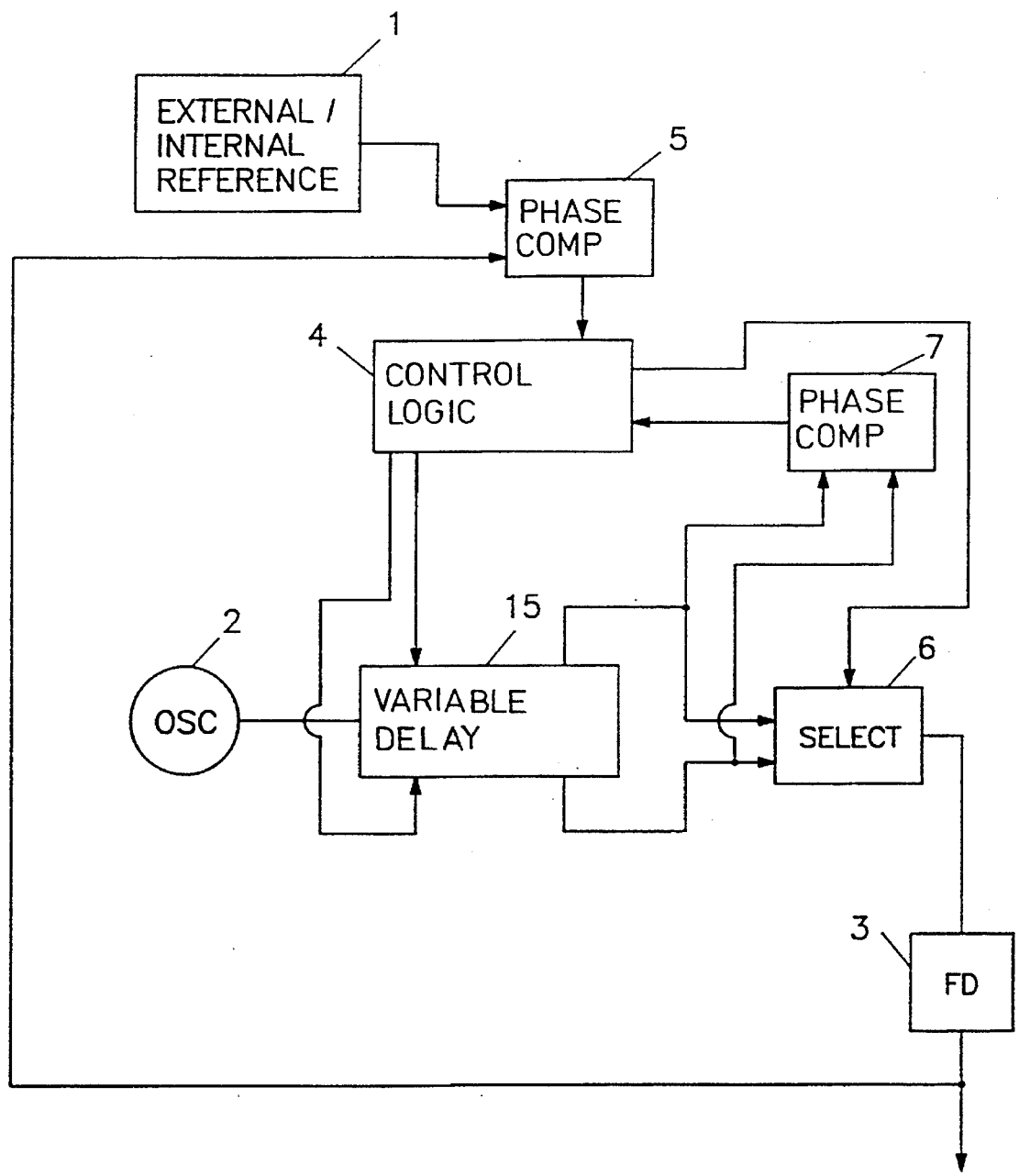
FIG. 4 illustrates a simplified device according to the present invention for continuously aligning a local oscillator with the aid of a delay line having two mutually independent tapping points.

FIG. 4 illustrates a further embodiment according to the present invention, comprising a device which instead of two separate, variable delay lines 10, 11 uses one single digital delay line 15 which includes a double array of signal tapping points or outlets. Remaining blocks 1–7 correspond to similar functional blocks in FIG. 3. Each signal outlet in the delay line is selected digitally by two control inputs which are controlled by the control logic 4, similar to the FIG. 3 embodiment. Thus, in this case, the actual delay line 15 is constantly active and instead operates with an active and an inactive signal tapping of the delay line. In other respects, the function is identical with the function discussed with reference to FIG. 3. This latter solution, however, has the advantage that any differences in manufacturing tolerances with regard to the delay steps in separate delay lines such as lines 10 and 11 in FIG. 3 will be avoided by the solution according to FIG. 4.

Figure 5:
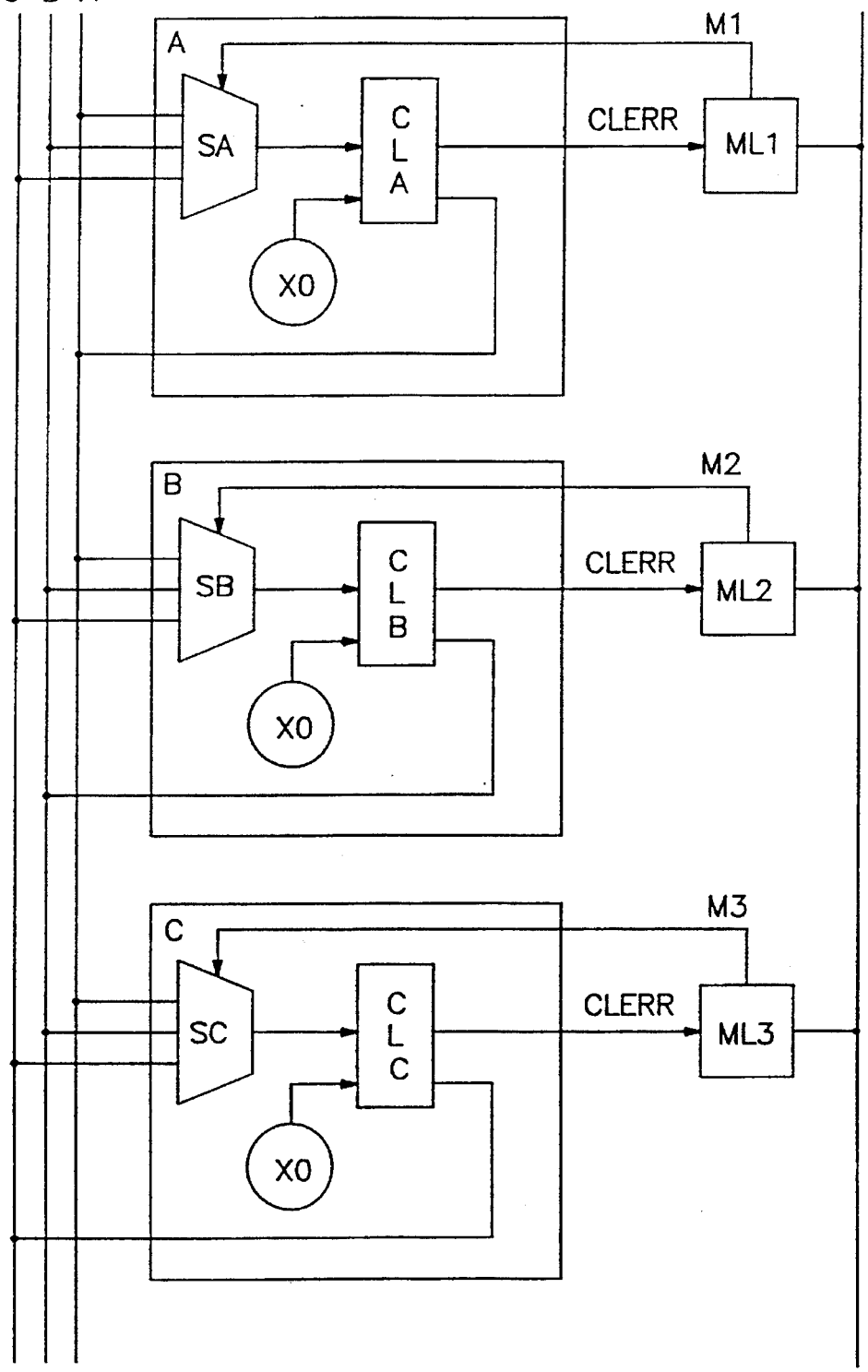
FIG. 5 is a block schematic illustrating an application which uses three oscillator arrays in accordance with the present invention.

FIG. 5 illustrates a use application of the clock oscillator arrangement in accordance with the present invention. In the illustrated case, the device represented by the block schematic in FIG. 5 operates with three different planes referenced A, B and C, each of which includes a respective crystal-controlled clock oscillator XO, although the arrangement may, of course, be expanded with further planes. A reference or master is selected via a respective selector SA, SB and SC with the aid of maintenance logic ML1, ML2 and ML3 respectively, each of which influences the choice of reference at selector SA, SB and SC with a respective control line M1, M2 and M3. According to the invention, each oscillator XO is controlled and phase-compensated against the selected reference in accordance with FIG. 3 or FIG. 4. Respective control logic CLA, CLB and CLC deliver an error indication signal CLERR to respective maintenance logic ML1, ML2 and ML3. In principle, this error indication signal is obtained with the aid of the phase comparator 5 in FIG. 4 or FIG. 5. The error indication signal indicates that a given plane is no longer able to align the phase of its crystal oscillator XO with a given reference phase. This thus indicates the existence of an error, but because the redundancy existing in the system the faulty oscillator can be excluded from the system until the error has been rectified. The total function of the system will therefore not be affected. The inventive circuit thus enables the phase output of each plane to be monitored and controlled continuously, so that this phase will coincide with the phase of the other two planes in normal cases when no error or fault exists. It will be seen that, in principle, any one of planes A, B or C can serve as a reference and that if one plane should become faulty, there still remain two planes which, in principle, can control each other until the faulty oscillator XO has been rectified.

I claim:

1. A method of aligning the phase of a stable local frequency oscillator, whose phase and frequency differ from and is not based on a phase and frequency of a reference signal, utilizing a phase comparator and digitally incrementally variable delay lines so as to align a phase of the signal from the local frequency stable oscillator with the phase of said reference signal to also compensate buffering delays, said method comprising the steps of:

momentarily switching between an active delay line and an inactive delay line in series with a signal from said stable local frequency oscillator when said active delay line approaches its phase adjustment limit, there being in absolute phase a difference of one clock period between said active and said inactive delay line, whereby when switching between said lines there is achieved an exchange of function such that an earlier active delay line will then constitute the inactive delay line and an earlier inactive delay line will constitute the active delay line up to a time at which a further switch is made, so as to obtain delay-wise unlimited continuous incremental phase alignment of the signal from said stable local frequency oscillator with said phase of said reference signal; and adjusting said inactive delay line with at least plus or minus one clock period of the signal from said stable local frequency oscillator when said inactive delay line approaches a limit of its phase regulating ability, such that relative phase from said inactive delay line will continue to coincide with an output phase from said active delay line, to obtain a correct clock phase with any output of said stable local frequency oscillator.

2. The method according to claim 1, wherein two distinct parallel digitally incrementally variable delay lines are used whose mutually relative delays differ by a value which corresponds at least to one whole period of the frequency of said stable local frequency oscillator.

3. The method according to claim 1, wherein a digitally incrementally variable delay line is used including two arrays of tapping-points whose mutually relative delays differ by an amount which at least corresponds to one whole period of the frequency of said stable local frequency oscillator.

4. A device for aligning the phase of the signal output from a stable local frequency oscillator with the phase of a given internal or external reference frequency, comprising a phase comparator, counter logic and a digitally incrementally-variable delay line, further including an additional phase comparator and a selection circuit, said selection circuit being controlled by control logic including the counter logic, wherein said digitally incrementally variable delay line is in series with said stable local frequency oscillator which is divided into two parallel delay lines, a first delay line and a second delay line which, with the aid of said additional phase comparator, produce a same relative phase delay, said first delay line being placed in an active mode by the selection circuit whereas said second delay line becomes inactive and the inactive delay line has an absolute phase which differs by plus or minus one full period or several full periods of the oscillating frequency of said stable local frequency oscillator, and said selection circuit delivering the signal from the delay line that has been placed in an active mode, to obtain a correct clock phase with any output of said stable local frequency oscillator.

5. The device according to claim 4, wherein said first and said second variable delay lines comprise two distinct and mutually separate digitally incrementally variable delay lines.

6. The device according to claim 4, wherein said first and said second variable delay lines consist of one single digitally incrementally variable delay line which includes two mutually separate and controllable tapping-points.

7. The device according to claim 5, wherein the device with the exclusion of a resonator element for said stable local frequency oscillator forms an integrated circuit module.

8. The device according to claim 5, wherein the device inclusive of a resonator element for said stable local frequency oscillator forms an LSI-module.

9. The device according to claim 6, wherein the device with the exclusion of a resonator element for said stable local frequency oscillator forms an integrated circuit module.

10. The device according to claim 6, wherein the device inclusive of a resonator element for said stable local frequency oscillator forms an LSI-module.

11. The method according to claim 1, wherein there is a difference of several whole clock periods between said active and said inactive delay lines.

12. The device according to claim 7, wherein said resonator element is a quartz crystal.

13. The device according to claim 8, wherein said resonator element is a quartz crystal.

14. The device according to claim 9, wherein said resonator element is a quartz crystal.

15. The device according to claim 10, wherein said resonator element is a quartz crystal.

16. The method according to claim 1, wherein said reference signal is generated by an external reference source.

17. The method according to claim 1, wherein said reference signal is generated by an internal reference source.

* * * * *